(12) United States Patent
Kaneko

(10) Patent No.: US 10,651,185 B2
(45) Date of Patent: May 12, 2020

(54) SEMICONDUCTOR DEVICE AND METHOD OF MANUFACTURING THE SAME

(71) Applicant: TOSHIBA MEMORY CORPORATION, Minato-ku, Tokyo (JP)

(72) Inventor: Akio Kaneko, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 201 days.

(21) Appl. No.: 15/694,737

(22) Filed: Sep. 1, 2017

(65) Prior Publication Data

US 2018/0277554 A1 Sep. 27, 2018

(30) Foreign Application Priority Data

Mar. 23, 2017 (JP) ................. 2017-057711

(51) Int. Cl.

| | |
|---|---|
| *H01L 27/11556* | (2017.01) |
| *H01L 27/11582* | (2017.01) |
| *H01L 29/10* | (2006.01) |
| *H01L 21/768* | (2006.01) |
| *H01L 23/522* | (2006.01) |
| *H01L 23/528* | (2006.01) |
| *H01L 23/532* | (2006.01) |
| *H01L 27/11524* | (2017.01) |
| *H01L 27/1157* | (2017.01) |
| *H01L 29/49* | (2006.01) |

(52) U.S. Cl.
CPC .... *H01L 27/11556* (2013.01); *H01L 21/7682* (2013.01); *H01L 23/528* (2013.01); *H01L 23/5226* (2013.01); *H01L 23/53271* (2013.01); *H01L 27/1157* (2013.01); *H01L 27/11524* (2013.01); *H01L 27/11582* (2013.01); *H01L 29/1045* (2013.01); *H01L 29/4916* (2013.01)

(58) Field of Classification Search
CPC ............. H01L 27/11582; H01L 21/265; H01L 21/768; H01L 21/268
See application file for complete search history.

(56) References Cited

U.S. PATENT DOCUMENTS

| | | | |
|---|---|---|---|
| 6,933,556 B2 | 8/2005 | Endoh et al. | |
| 7,847,334 B2 | 12/2010 | Katsumata et al. | |
| 2016/0240476 A1* | 8/2016 | Takahashi | ........... H01L 23/5283 |
| 2016/0247816 A1* | 8/2016 | Kuniya | ............. H01L 27/11582 |

(Continued)

*Primary Examiner* — Seahvosh Nikmanesh
(74) *Attorney, Agent, or Firm* — Foley & Lardner LLP

(57) ABSTRACT

A semiconductor device includes a first electrode layer and a second electrode layer formed thereon to be spaced from the first electrode layer, a columnar portion penetrating the first and second electrode layers in a first direction and including a semiconductor layer, a first insulating film between the first and second electrode layers and the semiconductor layer and in contact with the first electrode layer, a charge storage layer between the second electrode layer and the first insulating film, and an insulating film between the second electrode layer and the charge storage layer. The semiconductor layer includes a first portion facing the second electrode layer in a second direction intersecting with the first direction and a second portion in contact with the first portion in the first direction. A concentration of a impurity contained in the second portion is higher than that of the impurity contained in the first portion.

7 Claims, 11 Drawing Sheets

(56) References Cited

U.S. PATENT DOCUMENTS

| | | |
|---|---|---|
| 2016/0268292 A1 | 9/2016 | Ito et al. |
| 2016/0322373 A1 | 11/2016 | Sakamoto et al. |
| 2017/0025431 A1* | 1/2017 | Kanakamedala ............................ H01L 27/11578 |
| 2017/0103993 A1* | 4/2017 | Lee .................... H01L 27/11565 |
| 2017/0162594 A1* | 6/2017 | Ahn ........................ H01L 21/31 |
| 2017/0207232 A1* | 7/2017 | You .................... H01L 27/11521 |
| 2017/0229472 A1* | 8/2017 | Lu ...................... H01L 27/11582 |

* cited by examiner

SEMICONDUCTOR DEVICE AND METHOD OF MANUFACTURING THE SAME

CROSS-REFERENCE TO RELATED APPLICATION

This application claims the benefit of and priority to Japanese Patent Application No. 2017-057711; filed Mar. 23, 2017, the entire contents of which are incorporated herein by reference.

FIELD

Embodiments described herein relate generally to a semiconductor device and a method of manufacturing the same.

BACKGROUND

In a three-dimensional arrangement of memory cells, a memory hole is formed in a stacked body in which a plurality of electrode layers functioning as a control gate in a memory device and insulating layers are alternately stacked, a charge storage layer is formed on an inner wall of the memory hole, and then silicon is provided in the memory hole.

DETAILED DESCRIPTION

Example embodiments provide a semiconductor device in which inter-cell interference is further reduced and a method of manufacturing the same.

In general, according to some embodiments, a semiconductor device may include an under layer, a first electrode layer formed on the under layer, a second electrode layer formed on the first electrode layer so as to be spaced from the first electrode layer, a columnar portion penetrating the first and second electrode layers in a first direction, which is a stacking direction, and including a semiconductor layer, a first insulating film provided between the first and second electrode layers and the semiconductor layer and in contact with the first electrode layer, a charge storage layer provided between the second electrode layer and the first insulating film, and a second insulating film provided between the second electrode layer and the charge storage layer. In some embodiments, in the semiconductor device, the semiconductor layer may include a first portion facing the second electrode layer in a second direction intersecting with the first direction and a second portion being in contact with the first portion in the first direction, and a concentration of a first impurity contained in the second portion is higher than a concentration of the first impurity contained in the first portion.

Embodiments of this disclosure will be described below.

Figure 1:
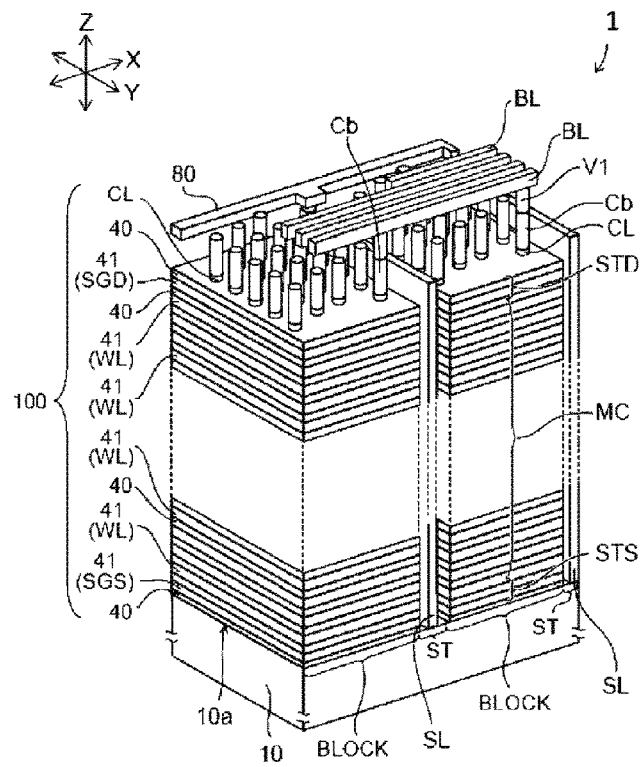
FIG. 1 is a view illustrating a memory cell of a semiconductor device according to some embodiments.

FIG. 1 is a schematic perspective view of a memory cell array of a semiconductor device according to some embodiments.

In the semiconductor device of some embodiments as illustrated in FIG. 1, two directions parallel to a main surface 10a of a substrate 10 and orthogonal to each other are defined as an X-direction and a Y-direction, and a direction orthogonal to both the X-direction and the Y-direction is defined as a Z-direction.

A memory cell array 1 of the semiconductor device according to some embodiments includes a stacked body 100 including a plurality of electrode layers 41, a plurality of columnar portions CL, and a plurality of dividing portions ST. In some embodiments, the plurality of electrode layers 41 are stacked on the main surface 10a of the substrate 10 to be spaced from each other. In some embodiments, the substrate 10 may be formed of, for example, p-type polysilicon or non-doped silicon. In some embodiments, the number of the plurality of electrode layers 41 is arbitrary, while the number of the plurality of electrode layers 41 is not greater than a predetermined number in some embodiments.

In some embodiments, the plurality of electrode layers 41 include a drain-side select gate electrode SGD, a plurality of word lines WL, and a source-side select gate electrode SGS. In some embodiments, the source-side select gate electrode SGS is provided on the substrate 10. In some embodiments, the plurality of word lines WL are on the source-side select gate electrode SGS. In some embodiments, the drain-side select gate electrode SGD is provided on the plurality of word lines WL.

In some embodiments, the drain-side select gate electrode SGD may function as a gate electrode of a drain-side select transistor STD. In some embodiments, the source-side select gate electrode SGS may function as a gate electrode of a source-side select transistor STS. In some embodiments, a plurality of memory cells MC are connected to each other in series between the drain-side select transistor STD and the source-side select transistor STS. In some embodiments, one word line WL may function as a gate electrode of one memory cell MC.

In some embodiments, the number of layers of the drain-side select gate electrode SGD and the source-side select gate electrode SGS may be any number of layers, for example, may be one or more layers. In some embodiments, the number of layers of the drain-side select gate electrode SGD may be any number of layers, for example, may be one or more layers. In some embodiments, the number of layers of the source-side select gate electrode SGS may be any number of layers, for example, may be one or more layers.

In some embodiments, the electrode layer 41 may be made of, for example, doped silicon, the drain-side select gate electrode SGD and the source-side select gate electrode SGS are made of, for example, p-type polysilicon containing boron (B), and the word line WL is made of, for example, n-type polysilicon containing phosphorus (P), arsenic (As), or antimony (Sb).

In some embodiments, each of the electrode layers 41 may contain a metal such as tungsten or molybdenum.

In some embodiments, insulating layers 40 are disposed between the plurality of electrode layers 41, respectively. In some embodiments, the insulating layer 40 may be, for example, an insulator such as a silicon oxide film or an air gap.

In some embodiments, the stacked body 100 has the plurality of dividing portions ST. In some embodiments, the dividing portion ST extends the Z-direction and the Y-direction in the stacked body 100 (see FIG. 1). In some embodiments, the dividing portion ST divides the stacked body 100 in the X-direction (see FIG. 1). A region divided by the dividing portion ST is a minimum unit of information erase.

In some embodiments, a source layer SL is provided in the dividing portion ST. In some embodiments, the source layer SL maybe insulated from the stacked body 100, and spread in a plate shape in the Z-direction and the Y-direction, for example. In some embodiments, an upper layer interconnect 80 is provided above the source layer SL. In some embodiments, the upper layer interconnect 80 extends in the X-direction. In some embodiments, the upper layer interconnect 80 may be electrically connected to the plurality of source layers SL arranged along the X-direction.

In some embodiments, the source layer SL may be provided under the stacked body 100 instead of inside of the dividing portion ST.

In some embodiments, in the stacked body 100 divided by the dividing portion ST, the plurality of columnar portions CL are provided. In some embodiments, the columnar portions CL extend along the Z-direction in the stacked body 100.

In some embodiments, the columnar portions CL may be disposed, for example, in the form of a staggered arrangement or a square grid pattern in the memory cell array 1 (e.g., in a plan view of the memory cell array 1 in FIG. 1).

In some embodiments, a plurality of bit lines BL are provided above an upper end of the columnar portion CL. In some embodiments, the plurality of bit lines BL extend in the X-direction. In some embodiments, the upper end of the columnar portion CL may be electrically connected to one bit line BL via a contact portion Cb and a contact portion V1.

Figure 2:
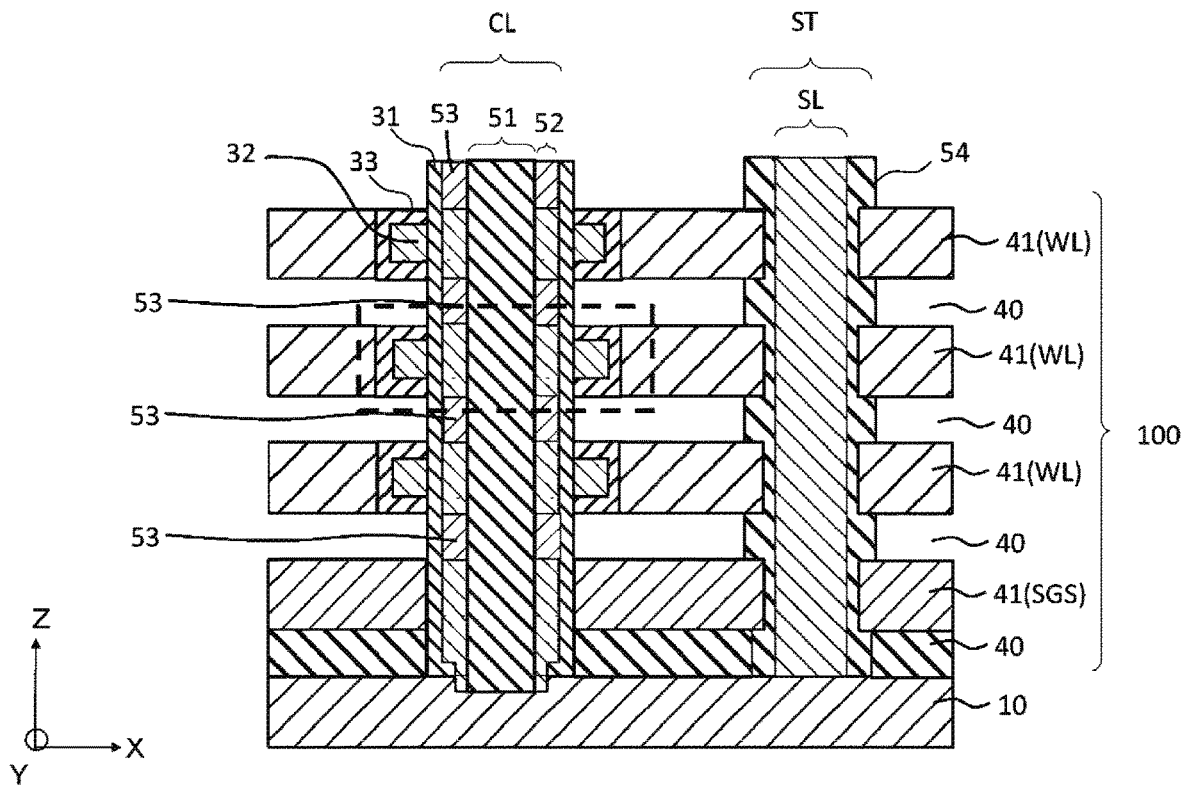
FIG. 2 is a cross-sectional view illustrating the memory cell of the semiconductor device according to some embodiments.

FIG. 2 is a schematic cross-sectional view taken along the columnar portion CL of the memory cell array of the semiconductor device according to some embodiments and a lower layer around the columnar portion. FIG. 2 corresponds to a part of a cross section parallel to the X-Z plane in FIG. 1. In the description with reference to the drawings subsequent to FIG. 2, a case where the insulating layer 40 is an air gap in some embodiments will be described as an example. In the following description, the source-side select gate electrode (SGS) of the electrode layer 41 is defined as a source-side select gate electrode 41, and the word line (WL) is defined as an electrode layer 41.

In some embodiments, as illustrated in FIG. 2, the stacked body 100 includes the plurality of electrode layers 41. In some embodiments, an air gap structure (e.g., the insulating layer 40 may be an air gap) is formed between the electrode layers 41. In some embodiments, the lowermost insulating layer 40 is formed with an insulating film (see FIG. 2) such as a silicon oxide film, so as to further maintain stability of the semiconductor device.

In some embodiments, as illustrated in FIG. 2, the columnar portion CL extends in the Z-direction in the stacked body 100, and may be electrically connected to the substrate 10. In some embodiments, the columnar portion CL has substantially a columnar shape.

In some embodiments, the columnar portion CL includes a core portion 51 and a semiconductor body 52. In some embodiments, the core portion 51 extends in the Z-direction in the stacked body 100. In some embodiments, the semiconductor body 52 is provided between the core portion 51 and the stacked body 100, and extends in the Z-direction. In some embodiments, the core portion 51 may be, for example, a silicon oxide film, and the semiconductor body 52 may be, for example, p-type polysilicon, n-type polysilicon, or non-doped silicon.

In some embodiments, a plurality of charge storage portions 32 are provided between the columnar portion CL and the plurality of electrode layers 41. In some embodiments, the charge storage portion 32 may be a floating gate or a charge trapping film. In some embodiments, an air gap 40 is formed between the charge storage portions 32 adjacent to each other in the Z-direction.

In some embodiments, a tunnel insulating film 31 is provided between the columnar portion CL and the respective charge storage portions 32 and between the columnar portion CL and the air gap 40. In some embodiments, the tunnel insulating film 31 has a cylindrical shape (see FIG. 2).

In some embodiments, a block insulating film 33 includes a portion provided between the charge storage portion 32 and the electrode layer 41 and a portion between the charge storage portion 32 and the air gap 40.

In some embodiments, the charge storage portion 32 may contain, for example, silicon. In some embodiments, in the case of being a floating gate, the charge storage portion 32 may retain charges. In some embodiments, in the case of being a charge trapping film, the charge storage portion 32 may have a trap site for trapping charges and traps the charges. In some embodiments, a threshold value (e.g., a threshold voltage) of the memory cell MC may vary depending on the amount of charges present in the charge storage portion. Thus, the memory cell MC can retain information. In some embodiments, the tunnel insulating film 31 may contain, for example, silicon oxide. In some embodiments, the tunnel insulating film 31 may serve as a potential barrier between the charge storage portion 32 and the semiconductor body 52. In some embodiments, charges may be tunneled through the tunnel insulating film 31 when the charges are injected to the charge storage portion 32 from the semiconductor body 52 (e.g., write operation) and when the charges are diffused from the charge storage portion 32 to the semiconductor body 52 (e.g., erasing operation). In some embodiments, the block insulating film 33 may contain, for example, aluminum oxide, and may contain silicon oxide, or may be a stacked film of the aluminum oxide and the silicon oxide. In some embodiments, the block insulating film 33 may prevent the charges from tunneling from the charge storage portion 32 to the word line during the write operation. In some embodiments, the block insulating film 33 may prevent the charges from back tunneling from the word line WL to the charge storage portion 32 during the erasing operation.

In some embodiments, the semiconductor body 52 has an impurity layer 53 in a region intersecting with the air gap in the XY plane. That is, in some embodiments, the impurity layer 53 may be formed on the semiconductor body 52 so as to be spaced from the electrode layer 41. In some embodiments, the impurity layer 53 is opposed to the air gap 40 via the tunnel insulating film 31.

In some embodiments, the impurity layer 53 may be an n-type impurity layer doped with phosphorus (P), for example. In some embodiments, the impurity layer 53 may contain not only phosphorus but also arsenic (As) or antimony (Sb) as an impurity. In some embodiments, the impurity layer 53 may function as a source/drain region. In some embodiments, in each of the electrode layers 41, the memory cell MC (indicated by a broken line part in FIG. 2) may be formed by the charge storage portion 32, the tunnel insulating film 31, and the impurity layer 53. That is, in some embodiments, the columnar portion CL is formed with a memory string (in the z-direction, for example) in which the plurality of memory cells MC are connected to each other in the Z-direction.

In some embodiments, as shown in FIG. 2, one memory cell MC is formed in a region where one electrode layer 41 and the columnar portion CL intersect with each other. In some embodiments, by an insulator (e.g., such as a silicon oxide film or an air gap) provided to divide the columnar portion CL in the Y-direction, two or more memory cells MC may be formed in the region where the electrode layer 41 and the columnar portion CL intersect with each other.

In some embodiments, the impurity layer 53 may be any type of impurity layer other than the n-type impurity layer. In some embodiments, the impurity layer 53 may be a p-type impurity layer. In some embodiments, the impurity layer 53 may have an impurity concentration higher than an impurity concentration of the semiconductor body 52 regardless of whether it is the n-type or the p-type. In some embodiments, the impurity layer 53 may have a peak concentration of about from $5e18/cm^3$ to $5e20/cm^3$, for example.

According to the semiconductor device of some embodiments, an air gap (e.g., 40 in FIG. 2) is provided between the electrode layers 41 adjacent to each other, whereby it is possible to reduce possibilities that the cells adjacent to each other interfere with each other (e.g., inter-cell interference) and reliability deteriorates. In some embodiments, the impurity layer 53 is formed on the semiconductor body 52, whereby it is hard to be affected by the adjacent memory cells, and thus the inter-cell interference can be further prevented.

A method of manufacturing the semiconductor device according to some embodiments will be described with reference to FIGS. 3A to 8.

FIGS. 3A to 8 are schematic cross-sectional views illustrating the method of manufacturing the semiconductor device according to some embodiments. FIGS. 3A to 8 correspond to the XZ cross section illustrated in FIG. 2, respectively.

Figure 3A:
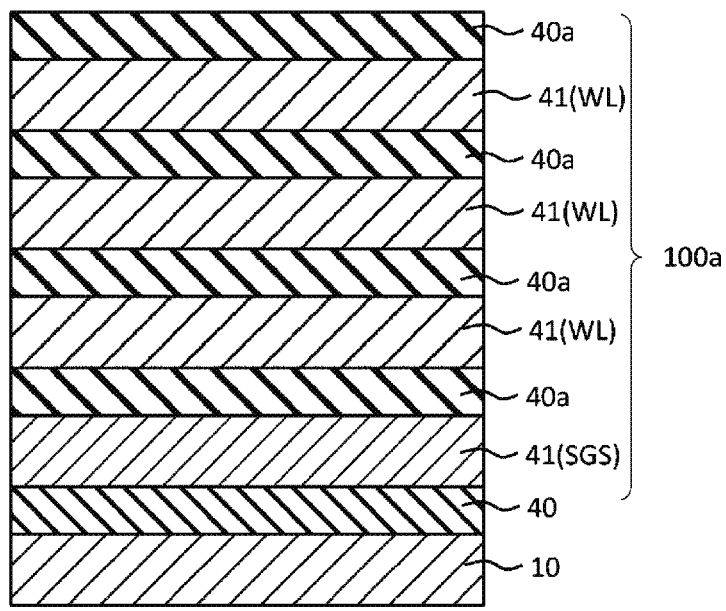
FIGS. 3A and 3B are views illustrating a method of manufacturing the semiconductor device according to some embodiments.

In some embodiments, as illustrated in FIG. 3A, an insulating layer 40 is formed on the substrate 10. In some embodiments, the insulating layer 40 may be a thermal silicon oxide film formed by thermal oxidation, for example. In some embodiments, a source-side select gate electrode 41 may be formed of a material containing p-type polysilicon, for example, and may be formed on the insulating layer 40. In some embodiments, on the source-side select gate electrode 41, an insulating layer 40a serving as a sacrificial layer and an electrode layer 41 may be alternately formed. Thereby, in some embodiments, a stacked body 100a including the insulating layer 40, the source-side select gate electrode 41, the sacrificial layer 40a, and the electrode layer 41 is formed on the substrate 10.

In some embodiments, the sacrificial layer 40a may be formed of a material containing n-type silicon doped with phosphorus (P), for example. In some embodiments, the electrode layer 41 maybe formed of a material containing n-type polysilicon.

Figure 3B:
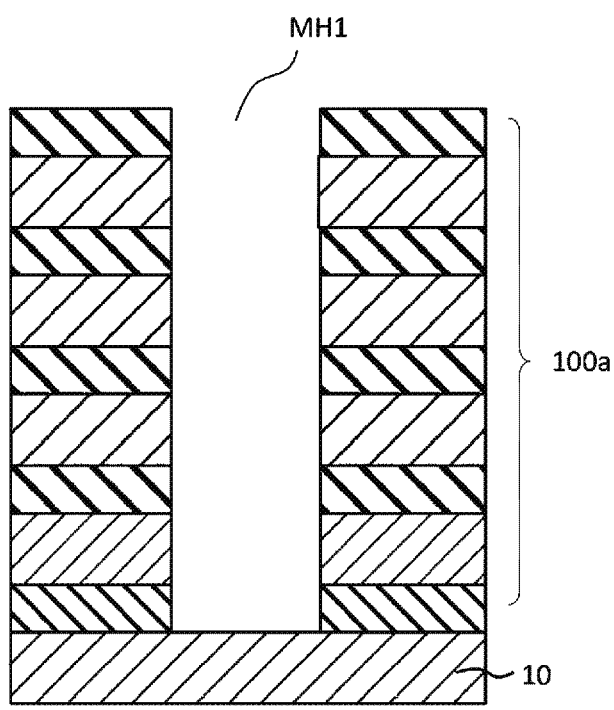

In some embodiments, as illustrated in FIG. 3B, a memory hole MH1 may be formed in the stacked body 100a using a photolithography method, for example. In some embodiments, the memory hole MH1 extends in the Z-direction in the stacked body 100a. In some embodiments, the memory hole MH1 penetrates the stacked body 100a and reaches an upper surface of the substrate 10.

Figure 4A:
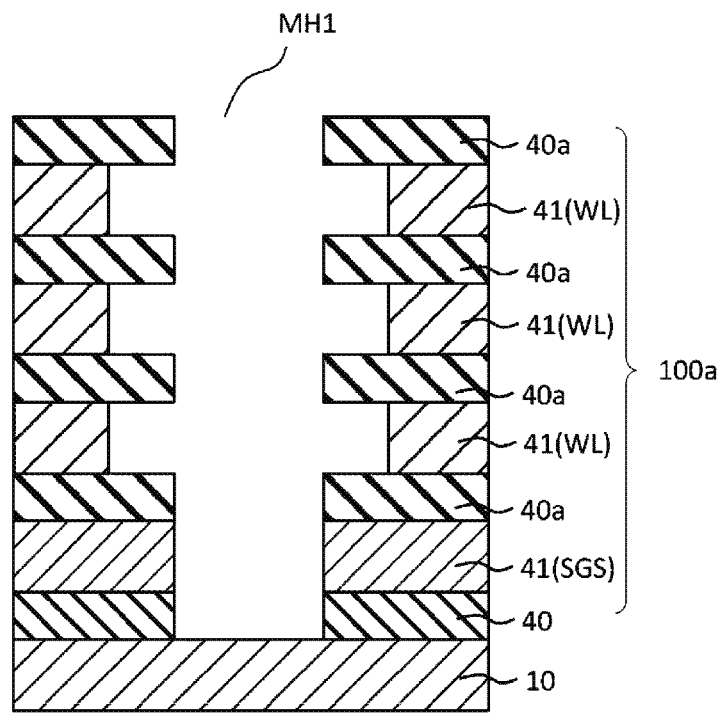
FIGS. 4A and 4B are views illustrating the method of manufacturing the semiconductor device according to some embodiments.

In some embodiments, as illustrated in FIG. 4A, a surface of the electrode layer 41 exposed in the memory hole MH1 is subjected to etching. In some embodiments, an etchant is supplied into the memory hole MH1. Thus, in some embodiments, a surface of the electrode layer 41 exposed in the memory hole MH1 recedes, and a recess is formed (see FIG. 4A). At this time, in some embodiments, the source-side select gate electrode 41 may be hardly etched because of containing a material different from a material of the electrode layer 41 and having an etching selectivity ratio different from an etching selectivity ratio of the electrode layer 41, for example.

Figure 4B:
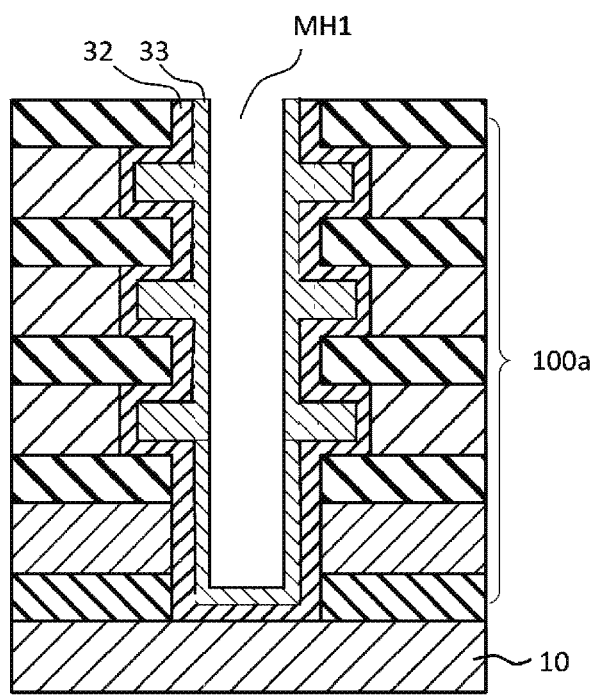

Next, in some embodiments as illustrated in FIG. 4B, a block insulating film 33 is formed on an inner wall of the recess generated by recession of the electrode layer 41. In some embodiments, the block insulating film 33 maybe formed of a material containing aluminum oxide, for example. In some embodiments, the block insulating film 33 may be formed of a material containing silicon oxide, for example. Thereafter, in some embodiments, a charge storage portion 32 is further formed in the recess. In some embodiments, the charge storage portion 32 may be formed of a material containing polysilicon or silicon nitride, for example. Further, in some embodiments, the block insulating film 33 and the charge storage portion 32 may be etched back by chemical dry etching or the like up to about a same diameter as the memory hole MH1 (e.g., a diameter of a hole bored in the sacrificial layer 40a). Thus, in some embodiments, the block insulating film 33 and the charge storage portion 32 are divided for each electrode layer 41. Therefore, in some embodiments, the block insulating film 33 and the charge storage portion 32 are embedded in the recess.

Figure 5A:
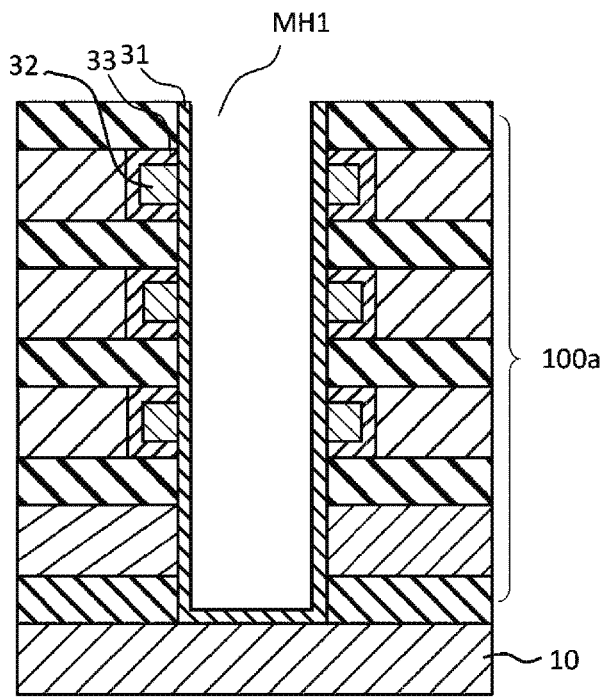
FIGS. 5A and 5B are views illustrating the method of manufacturing the semiconductor device according to some embodiments.

In some embodiments, as illustrated in FIG. 5A, a tunnel insulating film 31 is formed on an inner wall of the memory hole MH1. In some embodiments, the tunnel insulating film 31 may be formed of a material containing one or more selected from silicon oxide, silicon oxynitride, or silicon nitride, for example. In some embodiments, the tunnel insulating film 31 may be formed as a stacked film including a silicon oxide film, a silicon oxynitride film, and a silicon nitride film.

Figure 5B:
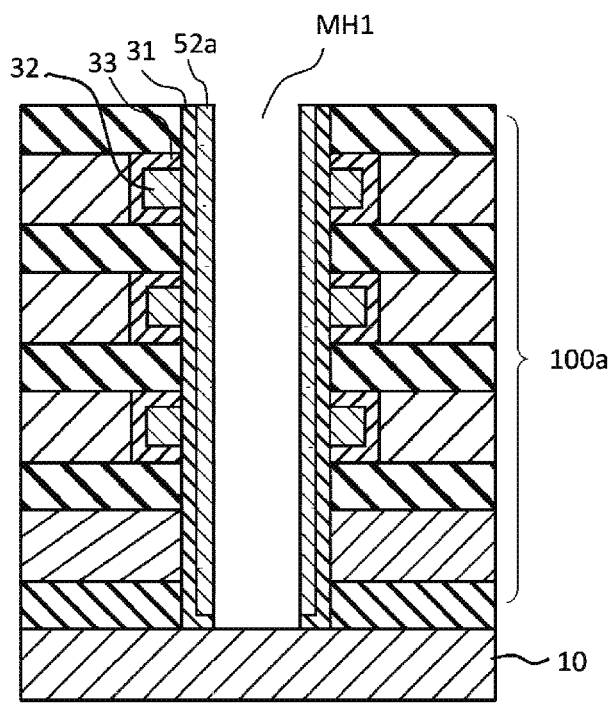

In some embodiments, as illustrated in FIG. 5B, a semiconductor film 52a is formed on the tunnel insulating film 31 (e.g., on the sidewall of the memory hole MH1). In some embodiments, the tunnel insulating film 31, which is formed on the bottom of the memory hole MH1, may be removed by anisotropic etching. At this time, in some embodiments, the tunnel insulating film 31 and the semiconductor film 52a, which are formed on the sidewall of the memory hole MH1, remain. In some embodiments, the tunnel insulating film 31 formed on the sidewall of the memory hole MH1 may be protected from the influence of the anisotropic etching by the semiconductor film 52a formed thereon.

Figure 6A:
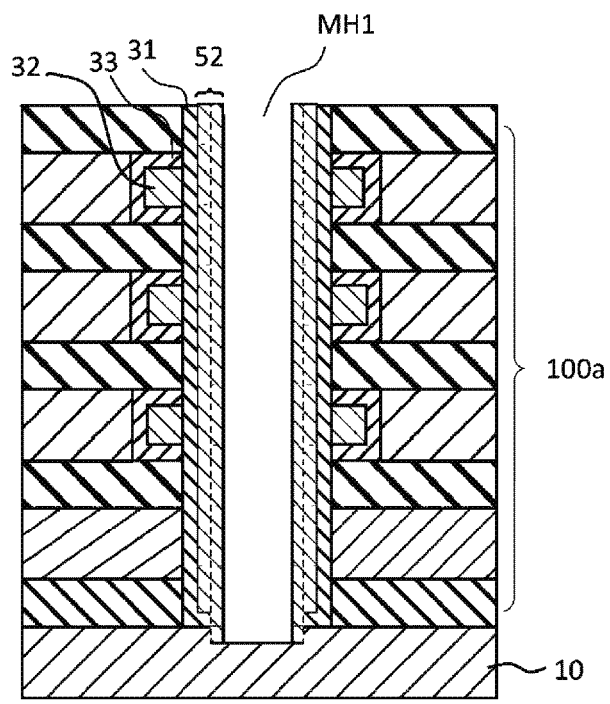
FIGS. 6A and 6B are views illustrating the method of manufacturing the semiconductor device according to some embodiments.

Thereafter, in some embodiments as illustrated in FIG. 6A, a semiconductor body 52 is formed in the memory hole MH1, and the semiconductor body 52 formed on the bottom of the memory hole MH1 is removed by etching. In some embodiments, the semiconductor body 52 maybe electrically connected to the substrate 10. In some embodiments, the semiconductor film 52a (see FIGS. 5A and 5B) may be a part of the semiconductor body 52.

Figure 6B:
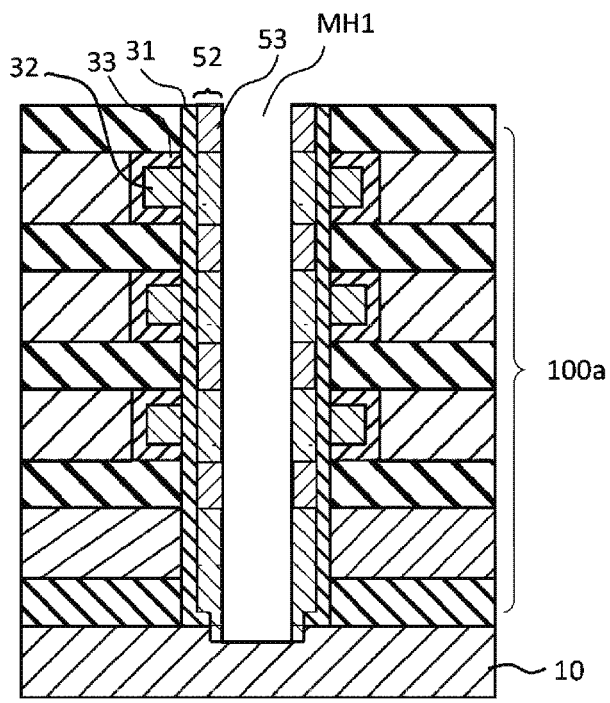

In some embodiments, annealing is subsequently performed. In some embodiments, as illustrated in FIG. 6B, an impurity doped in the sacrificial layer 40a may be diffused by annealing. In some embodiments, the impurity may pass through the tunnel insulating film 31, and may be diffused into the semiconductor body 52. Thereby, in some embodiments, phosphorus (P) may be diffused into a region where the semiconductor body 52 and the sacrificial layer 40a (see FIG. 4A) intersect with each other, and an n-type impurity layer 53 is formed.

Figure 7A:
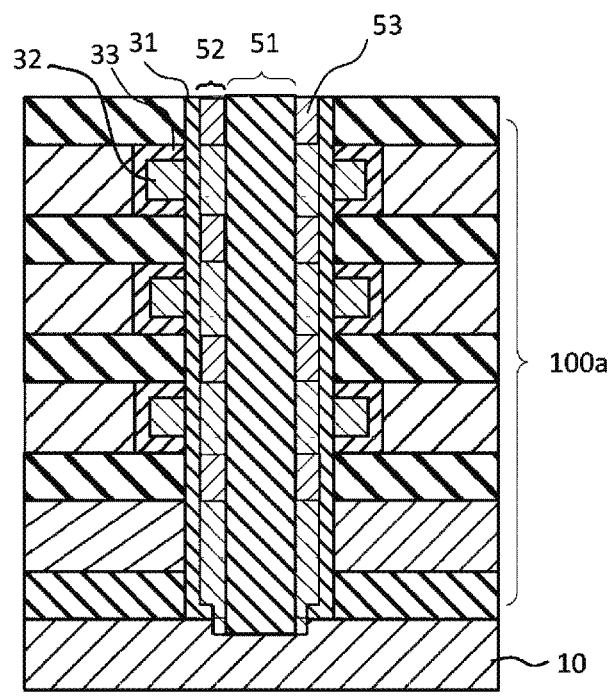
FIGS. 7A and 7B are views illustrating the method of manufacturing the semiconductor device according to some embodiments.

Subsequently, in some embodiments as illustrated in FIG. 7A, a core portion 51 is formed in the memory hole MH1. In some embodiments, the core portion 51 may be formed of a material containing silicon oxide, for example. In some embodiments, the semiconductor body 52 and the core portion 51 are embedded in the memory hole MH1 (see FIG. 7A).

Figure 7B:
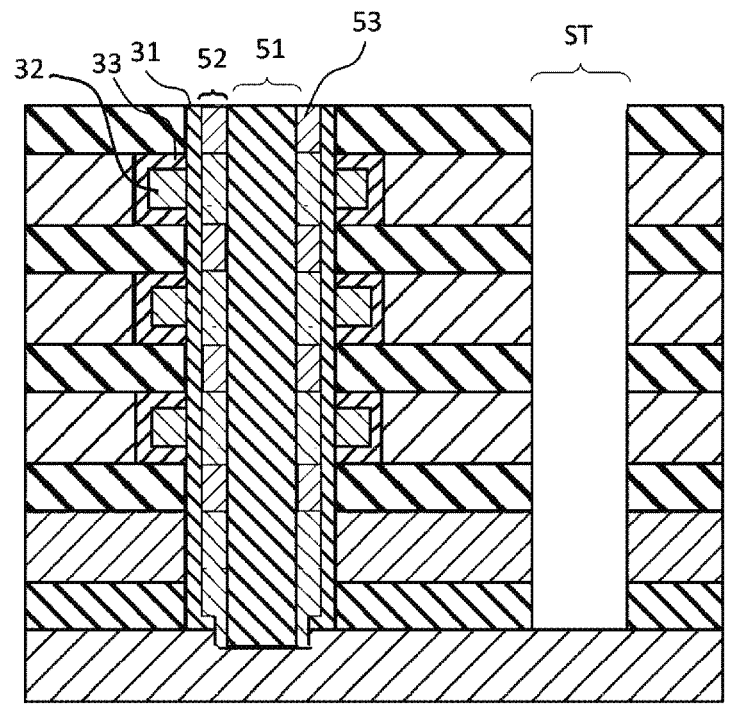

Subsequently, in some embodiments as illustrated in FIG. 7B, a dividing portion ST is formed on a side of the region where the memory hole is formed, thereby dividing the stacked body 100a in the YZ-direction. In some embodiments, from the dividing portion ST which is formed, the sacrificial layer 40a is removed by a replace process. Thus, in some embodiments, an air gap may be formed in the region where the sacrificial layer 40a is formed (see FIG. 7B). At this time, in some embodiments, the lowermost insulating layer 40 may be hardly removed and remain because of having a material different from a material of the sacrificial layer 40a.

Figure 8:
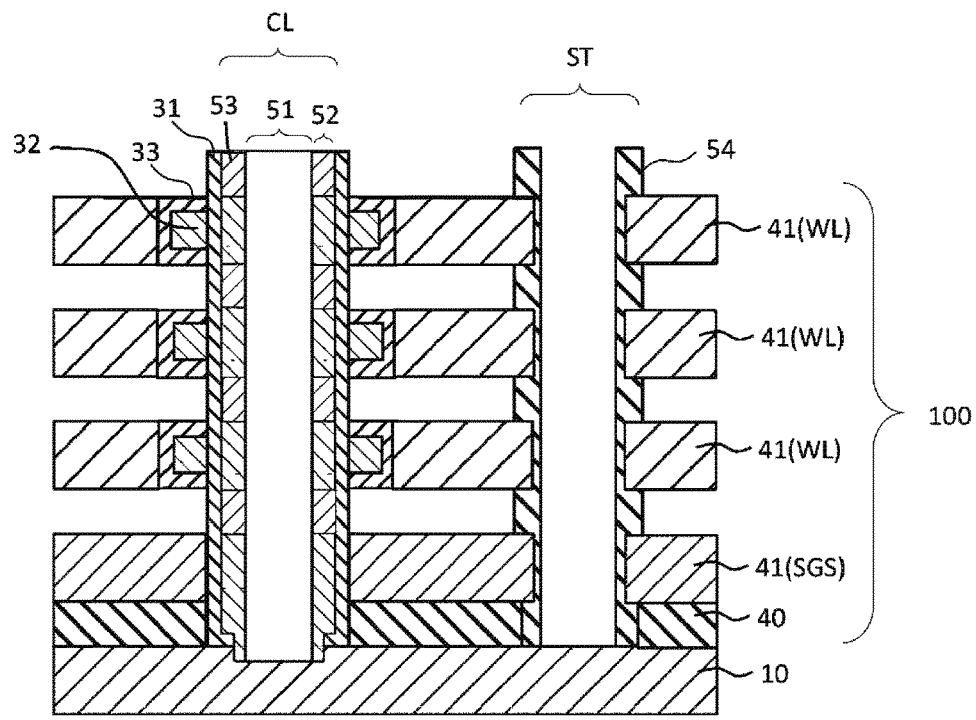
FIG. 8 is a view illustrating the method of manufacturing the semiconductor device according to some embodiments.

Next, in some embodiments as illustrated in FIG. 8, the side surface of the dividing portion ST may be covered with an insulating film 54 by CVD under a condition of comparatively poor coverage. In some embodiments, the condition of poor coverage means a condition under which the insulating film 54 covers the electrode layer 41, but the air gap is not filled. Finally, in some embodiments, a conductive layer is embedded in the insulating film 54 to form a source layer SL (see FIG. 2). In some embodiments, the source layer SL may be completely insulated from the electrode layer 41 by the insulating film 54.

In this way, the semiconductor device according to some embodiments is completed.

According to the semiconductor device of some embodiments, the air gap maybe provided between the electrode layers 41 adjacent to each other, and thus the inter-cell interference can be prevented. In some embodiments, the impurity layer may be provided on the region where the air gap and the semiconductor body intersect with each other, that is, both ends of the electrode layer, and thus the inter-cell interference can further be prevented.

In some embodiments, in a three-dimensional memory device, for example, it is possible to increase the number of electrode layers to be stacked in order to increase the memory capacity. In some embodiments, as the number of stacked layers increases, the height of the device may increase and a difficulty level of processing may rise, so there is a tendency to narrow the space between the electrode layers. However, as the space between the electrode layers becomes narrower, the inter-cell interference may become larger, and the reliability of the cell may deteriorate. According to the semiconductor device of some embodiments, it is possible to prevent the inter-cell interference even in a structure in which the space between the electrode layers is narrow.

Figure 9:
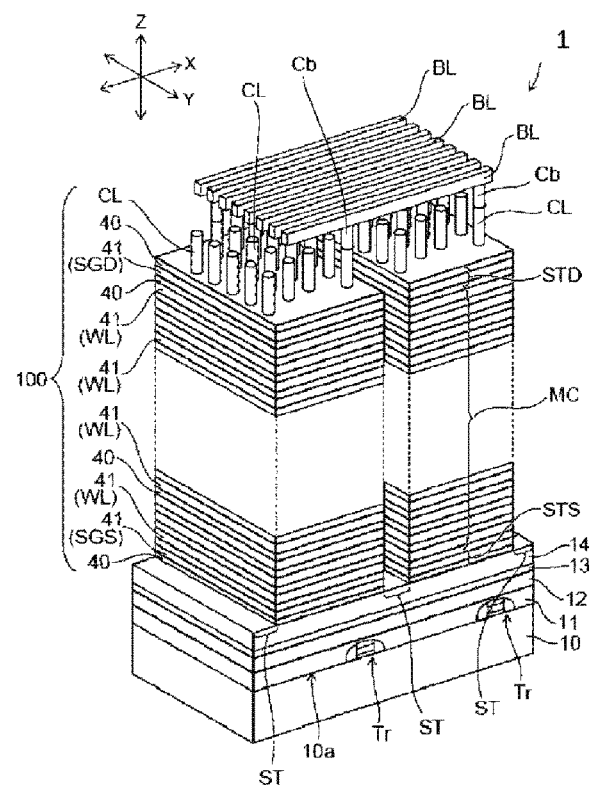
FIG. 9 is a view of a semiconductor device according to another example of some embodiments.

FIG. 9 is a schematic perspective view of a memory cell array of a semiconductor device according to some embodiments.

In some embodiments, as shown in FIG. 9, the memory cell array is formed on the substrate 10. In some embodiments, a peripheral circuit may be formed on a silicon substrate, an embedded source line electrode containing polysilicon or tungsten may be formed flat on the peripheral circuit, and a memory cell array may be formed on the embedded source line electrode.

In some embodiments, as illustrated in FIG. 9, a peripheral circuit 11 is provided on a main surface 10a of a substrate 10. In some embodiments, the peripheral circuit 11 includes a transistor Tr provided in an insulating film. In some embodiments, a source line electrode 12 (e.g., embedded source line electrode) is provided on the peripheral circuit 11. In some embodiments, an insulating film 13 is provided on the source line electrode 12. In some embodiments, a semiconductor layer 14 is provided on the insulating film 13. In some embodiments, a stacked body 100 is provided on the semiconductor layer 14.

Some embodiments will be described below with reference to FIGS. 10 to 13.

A semiconductor device of the embodiments illustrated in FIGS. 10 to 13 differs from that of the embodiments illustrated in FIGS. 2 to 9 in terms of a method of forming the tunnel insulating film 31. In some embodiments, the tunnel insulating film 31 may be formed by thermal oxidation. In some embodiments, the tunnel insulating film 31 may be selectively formed on a surface of a charge storage portion 32. The description of the same parts as in the embodiments illustrated in FIGS. 2 to 9 may be omitted.

Figure 10:
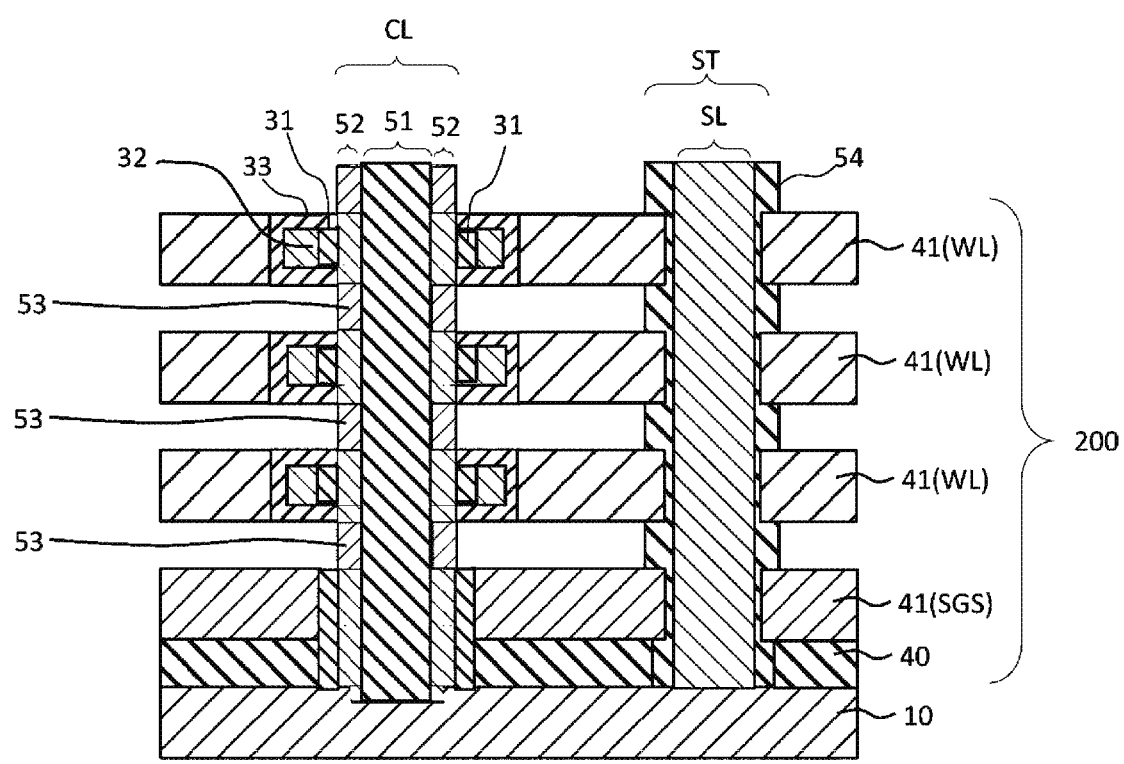
FIG. 10 is a view illustrating a memory cell of the semiconductor device according to some embodiments.

FIG. 10 is a schematic cross-sectional view taken along a columnar portion CL of a memory cell array of the semiconductor device according to some embodiments and a lower layer around the columnar portion. In some embodiments as illustrated in FIG. 10, the tunnel insulating film 31 of some embodiments is not provided continuously on the sidewall of the columnar portion CL but provided on the surface of the charge storage portion 32. In some embodiments, the other structures may be the same as those of the embodiments illustrated in FIGS. 2 to 9.

A method of manufacturing the semiconductor device according to some embodiments will be described below with reference to FIGS. 11A to 13.

First, an insulating layer 40 and a source-side select gate electrode 41 may be formed on a substrate 10, and a sacrificial layer 40a and an electrode layer 41 serving as a word line may be alternately stacked on the source-side select gate electrode 41, thereby obtaining a stacked body 200a. In some embodiments, a memory hole MH2 is formed in the stacked body 200a (e.g., in a similar manner as shown in FIGS. 3A and 3B).

Next, in some embodiments, the inside of the memory hole MH2 may be subjected to etching, and the electrode layer 41 may recede. In some embodiments, a block insulating film 33 and a charge storage portion 32 may be sequentially formed in a recess generated by recession of the electrode layer 41 (e.g., in a manner similar to those shown in FIGS. 4A and 4B).

Figure 11A:
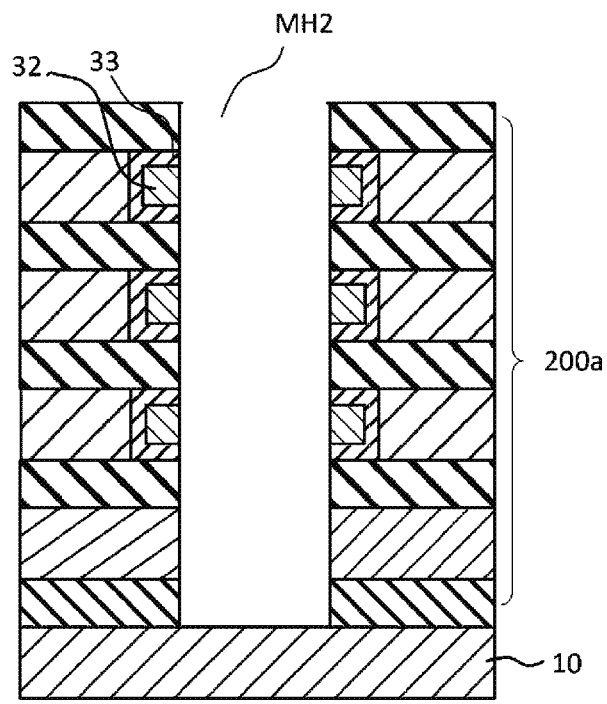
FIGS. 11A and 11B are views illustrating a method of manufacturing the semiconductor device according to some embodiments.

Subsequently, in some embodiments as illustrated in FIG. 11A, the block insulating film 33 and a charge storage portion 32 formed outside the recess generated by recession of the electrode layer 41 may be oxidized to form, for example, silicon oxide films (corresponding to reference numerals 33 and 31), and then the silicon oxide films may be removed by etching.

Figure 11B:
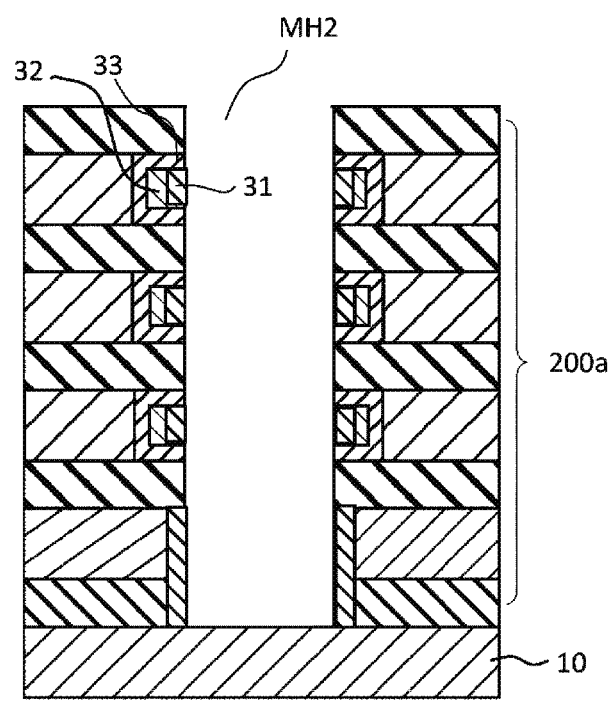

Subsequently, in some embodiments as illustrated in FIG. 11B, the stacked body 200a may be oxidized. Thus, in some embodiments, a portion of the charge storage portion 32 exposed to the memory hole MH2 may be oxidized, and a tunnel insulating film 31 may be formed. In some embodiments, the tunnel insulating film 31 may be formed not only in the charge storage portion 32 but also in the lowermost insulating layer 40 and the source-side select gate electrode 41 (see FIG. 11B).

Figure 12A:
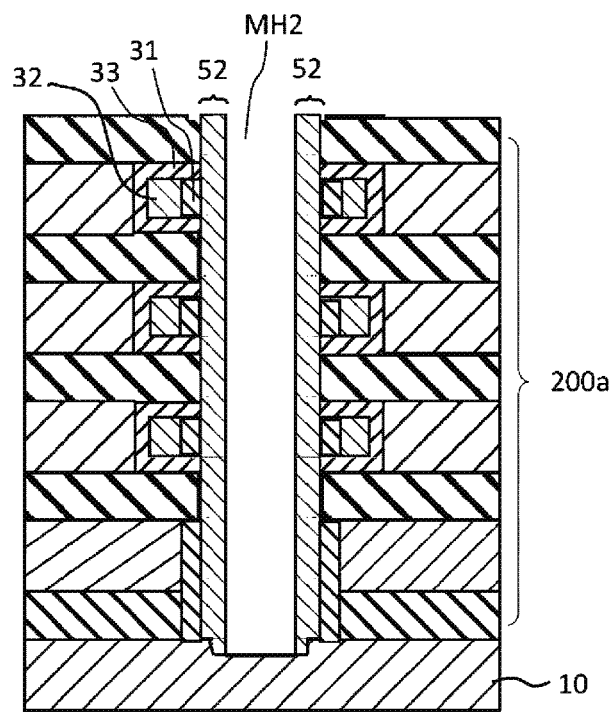
FIGS. 12A and 12B are views illustrating the method of manufacturing the semiconductor device according to some embodiments.
Figure 12B:
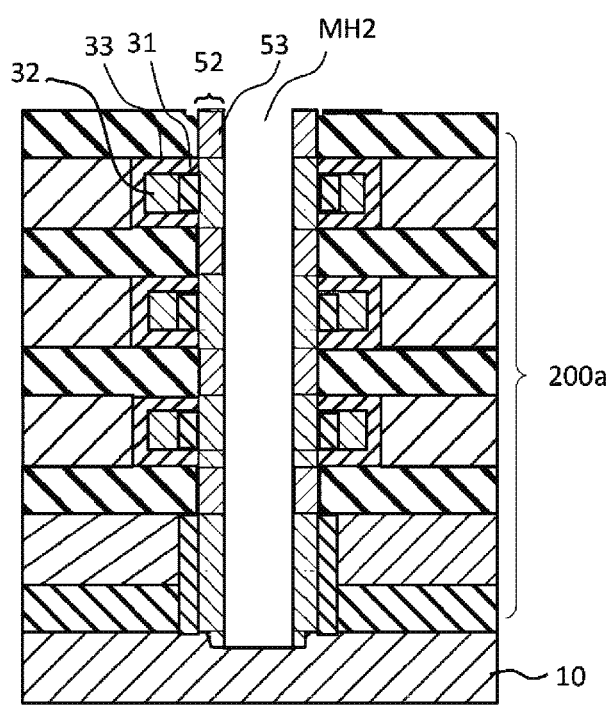

Next, in some embodiments, a semiconductor body 52 (including reference numeral 52a as shown in FIG. 5B) is formed in the memory hole MH2 (see FIG. 12A), and may be then subjected to annealing. In some embodiments, by the annealing, phosphorus (P), which is an impurity doped in the sacrificial layer 40a, may be diffused into the semiconductor body 52 as illustrated in FIG. 12B. Thus, in some embodiments, an n-type impurity layer 53 containing phosphorus (P) may be formed on the semiconductor body 52.

In some embodiments, as compared with the embodiments illustrated in FIG. 2 to FIG. 9, since the tunnel insulating film 31 is not provided between the sacrificial layer 40a and the semiconductor body 52, diffusion may easily occur.

Figure 13:
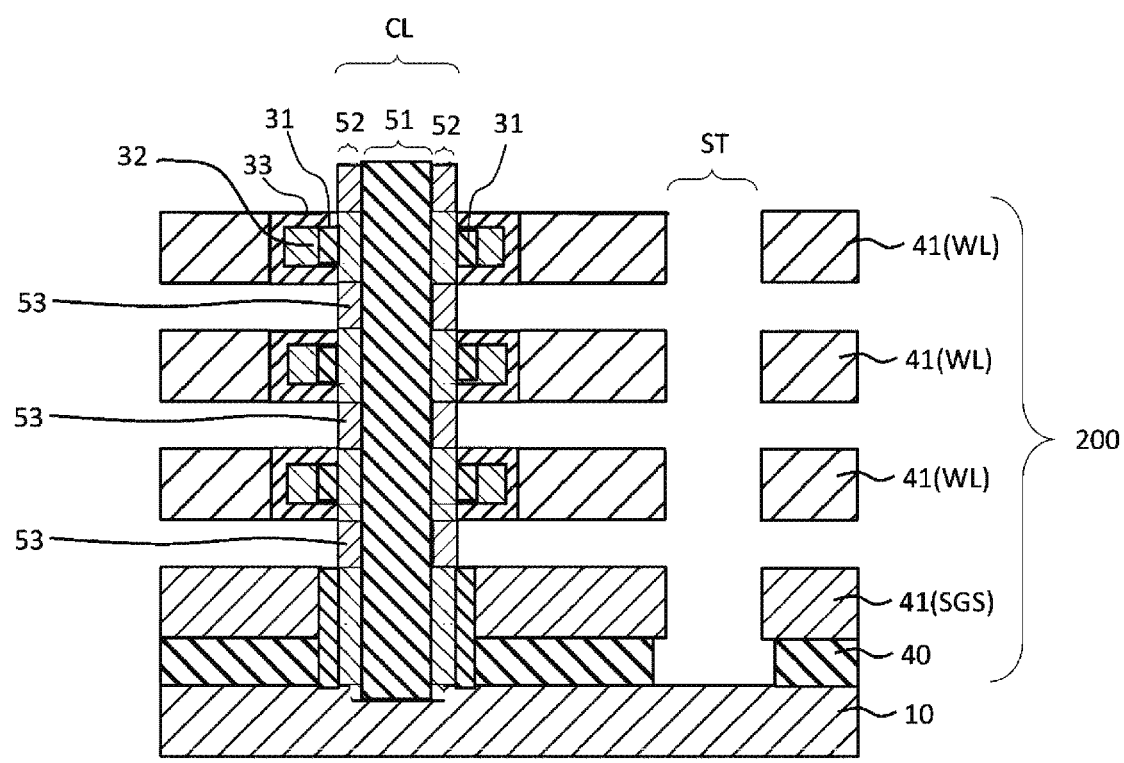
FIG. 13 is a view illustrating the method of manufacturing the semiconductor device according to some embodiments.

Thereafter, in some embodiments, a dividing portion ST is formed to divide the stacked body 200a, and the sacrificial layer 40a is removed (e.g, by a replace process), thereby forming a stacked body 200 (see FIG. 13). In some embodiments, an air gap is formed between the electrode layers 41 by the removal of the sacrificial layer 40a. In some embodiments, after the replace process, an end of the dividing portion ST may be filled with the insulating film 54 to form a source layer SL inside the insulating film 54 (see FIG. 10). Therefore, In some embodiments, the electrode layer 41 and the source layer SL can be electrically insulated from each other.

As described above, the semiconductor device according to some embodiments is manufactured.

According to the semiconductor device of some embodiments, it is possible to reduce the inter-cell interference.

Other examples exemplified in the embodiments illustrated in FIGS. 2 to 9 are also applicable to the embodiments illustrated in FIGS. 10 to 13.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device comprising:
an under layer;
a first electrode layer on the under layer;
a second electrode layer stacked on the first electrode layer in a stacking direction so as to be spaced from the first electrode layer in first direction, which is the stacking direction;
a columnar portion penetrating the first and second electrode layers in the first direction, the columnar portion including a semiconductor layer;
a first insulating film provided between the first and second electrode layers and the semiconductor layer and in contact with the first electrode layer;
a charge storage layer provided between the second electrode layer and the first insulating film; and
a second insulating film provided between the second electrode layer and the charge storage layer, wherein
the semiconductor layer includes a first portion facing the second electrode layer in a second direction intersecting with the first direction and a second portion being in contact with the first portion in the first direction, and
a concentration of a first impurity contained in the second portion is higher than a concentration of the first impurity contained in the first portion.

2. The semiconductor device according to claim 1, wherein an air gap is between the first electrode layer and the second electrode layer in the first direction.

3. The semiconductor device according to claim 1, wherein the first electrode layer is a p-type polysilicon layer, and the second electrode layer is an n-type polysilicon layer.

4. The semiconductor device according to claim 1, wherein the under layer is a substrate or a peripheral circuit disposed on the substrate.

5. The semiconductor device according to claim 1, further comprising an insulating layer being in contact with the under layer and the first electrode layer and disposed on the under layer.

6. The semiconductor device according to claim 1, wherein the second portion is an n-type impurity layer.

7. The semiconductor device according to claim 1, wherein the first impurity includes any one of phosphorus, arsenic, or antimony.

* * * * *